(12) United States Patent
Bhat et al.

(10) Patent No.: US 12,155,998 B2
(45) Date of Patent: *Nov. 26, 2024

(54) HEARING DEVICE COMPRISING AN AMPLIFIER SYSTEM FOR MINIMIZING VARIATION IN AN ACOUSTICAL SIGNAL CAUSED BY VARIATION IN GAIN OF AN AMPLIFIER

(71) Applicant: Oticon A/S, Smørum (DK)

(72) Inventors: Vijay Kumar Bhat, Smørum (DK); Poul Henriksen, Smørum (DK); Alberto Escolar Piedras, Smørum (DK)

(73) Assignee: OTICON A/S, Smørum (DK)

( * ) Notice: Subject to any disclaimer, the term of this patent is extended or adjusted under 35 U.S.C. 154(b) by 0 days.

This patent is subject to a terminal disclaimer.

(21) Appl. No.: 18/316,477

(22) Filed: May 12, 2023

(65) Prior Publication Data

US 2023/0283968 A1 Sep. 7, 2023

Related U.S. Application Data

(63) Continuation of application No. 17/361,523, filed on Jun. 29, 2021, now Pat. No. 11,711,656, which is a (Continued)

(30) Foreign Application Priority Data

Oct. 31, 2016 (EP) ..................................... 16196506

(51) Int. Cl.
*H04R 25/00* (2006.01)
*H03F 1/30* (2006.01)
(Continued)

(52) U.S. Cl.
CPC ............. *H04R 25/453* (2013.01); *H03F 1/30* (2013.01); *H03F 1/3258* (2013.01);
(Continued)

(58) Field of Classification Search
CPC .. H04R 25/453; H04R 25/505; H04R 25/602; H04R 2225/33; H04R 2225/43; H04R 2225/49
See application file for complete search history.

(56) References Cited

U.S. PATENT DOCUMENTS 6,236,731 B1 5/2001 Brennan et al.
6,310,960 B1 10/2001 Saaski et al.
(Continued)

FOREIGN PATENT DOCUMENTS

WO WO 2004/062089 A2 7/2004
WO WO 2004/062089 A3 7/2004

*Primary Examiner* — Suhan Ni
(74) *Attorney, Agent, or Firm* — Birch, Stewart, Kolasch & Birch, LLP

(57) ABSTRACT

The disclosure presents a method and an amplifier system for minimizing variation in an acoustical signal caused by variation in gain of an amplifier, comprising a battery for providing a supply voltage to the amplifier, a digital signal processor for providing the acoustical signal to the amplifier, a controller unit receiving an enablement signal when the supply voltage is in an offset mode, and based on the enablement signal requesting a measured voltage during a time period, and a first analog-to-digital converter configured for measuring the supply voltage to the amplifier when receiving the request from the controller unit or the first analog-to-digital converter is configured for measuring the supply voltage to the amplifier continuously, and where variations in the measured voltage relates to variations in the supply voltage during the time period. Furthermore, the controller unit is configured to predict offset modes (i.e. changes) in the supply voltage based on the enablement (Continued)

signals and a fitting of the measured voltages, and wherein the controller unit is configured to generate a compensating signal based on the fitting and transmit the compensating signal to the digital signal processor, the digital signal processor is then configured to minimize variation in the acoustical signal at the output of the amplifier by compensating the variation in gain of the amplifier based on the compensating signal.

20 Claims, 6 Drawing Sheets

Related U.S. Application Data continuation of application No. 16/728,895, filed on Dec. 27, 2019, now Pat. No. 11,082,776, which is a continuation of application No. 15/797,800, filed on Oct. 30, 2017, now Pat. No. 10,560,787.

(51) Int. Cl.
*H03F 1/32* (2006.01)
*H03F 3/181* (2006.01)
*H03F 3/183* (2006.01)
*H03F 3/217* (2006.01)

(52) U.S. Cl.
CPC ........... *H03F 1/3264* (2013.01); *H03F 3/181* (2013.01); *H03F 3/183* (2013.01); *H03F 3/2175* (2013.01); *H04R 25/505* (2013.01); *H03F 2200/03* (2013.01); *H03F 2200/321* (2013.01); *H03F 2200/351* (2013.01); *H03F 2200/375* (2013.01); *H03F 2200/393* (2013.01); *H03F 2200/471* (2013.01); *H03F 2201/3212* (2013.01); *H03F 2201/3227* (2013.01); *H04R 25/602* (2013.01); *H04R 2225/33* (2013.01); *H04R 2225/43* (2013.01); *H04R 2225/49* (2013.01)

(56) References Cited

U.S. PATENT DOCUMENTS

| | | |
|---|---|---|
| 6,658,124 B1 | 12/2003 | Meadows |
| 7,800,437 B2 | 9/2010 | Khoury et al. |
| 8,831,256 B2 | 9/2014 | Fort et al. |
| 2014/0003641 A1 | 1/2014 | Neumeyer et al. |
| 2014/0044293 A1 | 2/2014 | Ganem et al. |
| 2014/0266433 A1 | 9/2014 | Nobbe et al. |
| 2014/0292406 A1 | 10/2014 | Dechen et al. |
| 2015/0189447 A1 | 7/2015 | Vinter |
| 2018/0332408 A1 | 11/2018 | Frei et al. |
| 2019/0239005 A1 | 8/2019 | Sandhu et al. |

HEARING DEVICE COMPRISING AN AMPLIFIER SYSTEM FOR MINIMIZING VARIATION IN AN ACOUSTICAL SIGNAL CAUSED BY VARIATION IN GAIN OF AN AMPLIFIER

CROSS-REFERENCE TO RELATED APPLICATIONS

This application is a Continuation of copending application Ser. No. 17/361,523, filed Jun. 29, 2021, which is a Continuation of application Ser. No. 16/728,895, filed Dec. 27, 2019 (now U.S. Pat. No. 11,082,776, issued Aug. 3, 2021), which is a Continuation of application Ser. No. 15/797,800, filed on Oct. 30, 2017 (now U.S. Pat. No. 10,560,787 issued Feb. 11, 2020), which claims priority under 35 U.S.C. § 119(a) to application Ser. No. 16/196,506.6, filed in Europe on Oct. 31, 2016, all of which are hereby expressly incorporated by reference into the present application.

TECHNICAL FIELD

The disclosure relates to an amplifier system for minimizing variation in an acoustical signal caused by variation in gain of an amplifier, in for example a hearing device.

BACKGROUND

Currently, it is known to implement a predictive feedback compensation in an amplifier for suppressing distortion caused by supply voltage variations and output amplitude switching. A predictive step in the predictive feedback compensation can include measuring a varying or alternating current component of a supply voltage to predict an output pulse amplitude error for a pulse width modulator (PWM) input signal based on a prior PWM output signal, or the predictive step can also include measuring a varying or alternating current component of an output pulse amplitude for the PWM output signal to predict the output pulse amplitude error for the PWM input signal based on a prior PWM output signal.

It is further known to apply a predictive feedback system including a compensation circuitry for compensating for variations in a first and a second voltage in response to a measured average of a first and a second voltage and a measured difference between the first and second voltages. Measuring circuitry measures the average and the difference of the first and second voltages U.S. Pat. No. 7,800,437 B2 discloses a method and system for closed loop feedback for pulse width modulated switching amplifiers using predictive feedback compensation for suppressing distortion caused by supply voltage variations.

WO 2004/062089 A2 discloses a delta-sigma modulator for driving an output stage is disclosed. The delta-sigma modulator operates M between first and second voltages and includes a loop filter, a quantizer, and a feedback loop coupling an output of the quantizer and an input of the loop filter. The feedback loop includes compensation circuitry for compensating for variations in the first and second voltages in response to a measured average of the first and second voltages and a measured difference between the first and second voltages. Measuring circuitry measures the average and the difference of the first and second voltages.

SUMMARY

An object of the present disclosure is to provide an amplifier system which improves the compensation of gain variation of an amplifier, such as a digital amplifier, caused by variations in the supply voltage to the amplifier.

Objects of the present disclosure are achieved by the present disclosure described in the accompanying claims and as described in the following.

An object of the present disclosure is achieved by an amplifier system for minimizing variation in an acoustical signal caused by variation in gain of an amplifier, comprising a battery for providing a supply voltage to the amplifier, a digital signal processor for providing the acoustical signal to the amplifier, a controller unit receiving an enablement signal when the supply voltage may in an offset mode, and based on the enablement signal requesting a measured voltage during a time period, and a first analog-to-digital converter configured for measuring the supply voltage to the amplifier when receiving the request from the controller unit or the first analog-to-digital converter may be configured for measuring the supply voltage to the amplifier continuously, and where variations in the measured voltage relates to variations in the supply voltage during the time period. Furthermore, the controller unit may be configured to predict offset modes (i.e. changes) in the supply voltage based on the enablement signals and a fitting of the measured voltages, and wherein the controller unit may be configured to generate a compensating signal based on the fitting and transmit the compensating signal to the digital signal processor, the digital signal processor may then be configured to minimize variation in the acoustical signal at the output of the amplifier by compensating the variation in gain of the amplifier based on the compensating signal.

A further object of the present disclosure is achieved by a hearing device comprising an amplifier system for minimizing variation in an acoustical signal caused by variation in a supply voltage to an amplifier. The amplifier system may comprise a battery configured to provide a supply voltage to the amplifier, a digital signal processor configured to provide an acoustical signal to the amplifier, a controller unit configured to receive an enablement signal when the supply voltage may be in an offset mode, wherein the supply voltage may be in the offset mode when the supply voltage short termly drops below or above a supply voltage threshold, and the controller unit may further be configured to transmit a request for a measured voltage during a time period based on the enablement signal, and a first analog-to-digital converter configured to measure during the time period the supply voltage to the amplifier based on the request for the measured voltage transmitted by the controller unit. The controller unit may be configured to determine another offset mode in the supply voltage based on a fitting of measured voltages of the supply voltage to the amplifier, and wherein the controller unit may be configured to generate a compensating signal based on an estimation of variation in the supply voltage in the another offset mode provided by the fitting of the measured voltages. Furthermore, the controller unit may be configured to transmit the compensating signal to the digital signal processor, the digital signal processor may be configured to minimize the variation in the acoustical signal by providing the compensating signal into the acoustical signal, wherein the compensating signal provides an amplification of the acoustical signal during another time period of the another offset mode.

The external processing unit may be configured to measure the supply voltage Vcc from the battery, and based on the measured supply voltage the external processing unit may be configured to generate the enablement signal. Additionally, the enablement signal may be generated if the measured supply voltage Vcc may be below or above an average supply voltage over a given time period, i.e. the supply voltage may be in an offset mode.

Additionally, or alternatively, the external processing unit may be configured to either transmit or receive data packets or audio packets or configured to detect whether the data packets or audio packets are transmitted or received via a transceiver unit.

For example, the transceiver unit and the amplifier system may be comprised by a hearing device.

For example, when the external processing unit detects a transmission or a receive event of a data packer or an audio packet, the enablement signal may be generated. The enablement signal may be generated because the amplifier system 1 expects a voltage drop in the supply voltage Vcc due to the transmission event or the receive event.

Additionally, or alternatively, the external processing unit may be configured to detect a write or a read event to a memory unit and generating the enablement signal based on the detected write or read event. The enablement signal may be generated because the amplifier system expects a voltage drop in the supply voltage Vcc due to the write event or to the read event.

A user may experience the variation in the acoustical signal caused by variation in gain of the amplifier as a degradation of the sound quality of the acoustical signal or as disturbance/noise added to the acoustical signal which may be uncorrelated to the user environment.

The variation in gain may be caused by variation in the supply voltage to the amplifier, and the variation in the supply voltage may be a sudden drop in the supply voltage due to a sudden increase in current draw on the supply voltage. In for example a hearing device comprising a microphone, a speaker, a wireless interface, a processor unit (including the amplifier system) and a battery for providing a supply voltage to the components of the hearing device, the wireless interface may need more power when transmitting or receiving a data packet or an audio packet, and the need for more power results in an increase in current draw on the supply voltage. The increase in current draw results in a drop in the supply voltage affecting the performance of the amplifier since the gain of the amplifier provided to the acoustical signal will be reduced.

The digital signal processor for providing the acoustical signal to the amplifier may comprise multiple components for processing the acoustical signal received by the digital signal processor. The components could for example be an upsampler involving interpolation of the incoming acoustical signal, a noise shaper involving quantization or bit-depth reduction of the acoustical signal (the purpose is to increase the apparent signal-to-noise ratio of the acoustical signal), and a pulse width modulation amplifier.

The digital signal processor and the amplifier system may be mounted on a printed circuit board (PCB) together with other external processing units, such as an Radio-Frequency (RF) processing unit including a wireless interface, such as WIFI, Bluetooth (Bluetooth Low energy) and/or telecoil. The external processing unit may be a memory unit for reading and writing data packets or audio packets. The external processing unit may be any units which are relevant for a hearing device.

The hearing device may be a hearing aid.

The controller unit receiving the enablement signal may be configured to predict or estimate the compensating signal based on the enablement signal and a measure of a voltage at a component within a hearing device. The voltage could be the supply voltage or an output voltage of that specific component. The component may be the amplifier, RF circuits, or other components affecting the acoustical signal. The enablement signal may be transmitted from an external processing unit, and where the enablement signal is indicating an event of which the external processing unit is in. The event of the external processing unit may for example be a wireless transmit or receive event when the external processing unit may be a radio-frequency processing unit.

The controller unit may include one or more compensating algorithms adaptable to any of the components within the hearing device. The compensating algorithm may be based on a fitting method, such as a linear fitting, polynomial fitting or any mathematical fitting method in time or frequency domain. Additionally, the fitting method may be used for predicting the coming variations in the supply voltage, i.e., the next offset modes in the supply voltage. The enablement signal may inform the controller unit about the reasons of the variations in the supply voltage, the amplitude and duration of the variation and the time of when the variation occurred in the supply voltage. For example, the controller unit may be connected to an RF processing unit configured to transmit and receive data packet and/or audio packet, and when the RF processing unit receives data packet via a Bluetooth link, the variation in the supply voltage is caused by the need of more power of a Bluetooth component within the RF processing unit. The need of more power of the Bluetooth component affects the supply voltage to the amplifier. In this specific example, the controller unit may be connected to other external processing units transmitting enablement signals to the controller unit. The enablement signal transmitted by the RF processing unit informs the controller unit the amplitude and duration of the variation in supply voltage and when the variation in the supply voltage occurred. Additionally, the enablement signal informs the reason of the variation in the supply voltage at a given time. Because of the information provided by the enablement signal, the controller unit may be able to distinguish between the variations in the supply voltage so that the controller unit may be able to predict the variations in the supply voltage caused by the received data packets of the RF processing unit.

The controller unit may be configured to receive multiple enablement signals, including information of the event, such as a time period of each event, an amplitude measure of each event, the type of the event and/or the time of when the variation in the supply voltage occurred. The multiple enablement signals may be transmitted by different external processing units and received by the controller unit simultaneously or sequentially. The controller unit may be able to distinguish between the enablement signals which it may receive simultaneously or sequentially. For example, a first group of enablement signals for a first group event is received by the controller unit sequentially and a second group of enablement signals of a second group event is received in parallel or in sequentially with the first group event. If the controller unit does not know the type of the event of the enablement signals, the controller unit will then mix the events from the two groups and perform a fitting of the measured voltages which will result in a less precise prediction of the coming offset modes in the supply voltage. In another example, if the enablement signals includes information of the event, the controller unit knows which events/groups each enablement signals belongs too, and thereby, the controller unit may be able to perform a fitting of variations in the supply voltage caused by either the first or the second group of enablement signals. The advantage of doing this is that the fitting becomes more precise, and thereby, the compensation of the variation in the supply voltage will be improved.

Additionally, if the second group of enablement signals are transmitted and received randomly by the controller unit and if the enablement signals do not include information of the event type, the controller unit will then perform a fitting of the first group of enablement signals which the preciseness of the fitting will be reduced.

The first analog-to-digital converter may be configured to measure the supply voltage to respective components of the hearing device, such as the amplifier. The first analog-to-digital converter may further be configured to detect when the supply voltage is in the offset mode, i.e. the supply voltage is distorted. For example, if the supply voltage suddenly drops below or above an average supply voltage over a given time period then the supply voltage is in the offset mode.

A second analog-to-digital converter may be configured to detect when the supply voltage is in the offset mode and the time period of the event causing the variations in the supply voltage.

The enablement signal may be generated by the second analog-to-digital converter when the supply voltage is in the offset mode.

The controller unit may perform a fitting based on the measured voltages and based on the information provided by the enablement signals, and the controller unit is configured to predict the coming offset mode in the supply voltage based on the fitting and the enablement signals. The prediction of the offset mode includes the time of when the offset mode will appear in the supply voltage, the amplitude level of the variation in the offset mode and the time period of the offset mode.

The controller unit generates a compensating signal based on the predicted offset modes and transmitting the compensating signal to the digital signal processor. The digital signal processor is then configured to minimize variation in the acoustical signal at the output of the amplifier when the supply voltage is in the offset mode.

The acoustical signal at the output of the amplifier may be expressed by a transfer function, and the digital signal processor may be configured to modify the transfer function by e.g. multiplying a constant which is calculated based on the compensating signal. The digital signal processor may be configured to adjust the transfer function via the constant based on the compensating signal for minimizing variation in the acoustical signal at the output of the amplifier during an offset mode.

The transfer function is a mathematical function giving the corresponding output value of for example the amplifier or a speaker for each possible value of the acoustical signal entering the digital signal processor.

Alternatively, the transfer function is a mathematical function giving the corresponding input value of for example the amplifier or a speaker for each possible value of the acoustical signal entering the digital signal processor.

The constant may be applied to the transfer function in order to provide a gain to the acoustical signal expressed by the transfer function. The gain may be provided by a multiplier.

The enablement signal is for indicating possible disturbances in the supply voltage caused by e.g. changed current draw from functional entities like a RF processing unit, a memory, etc. The enablement signal may comprise further information such as the type of event, i.e. the event which causing the disturbances, the time period of each disturbances and the expected amplitude of each disturbance so that the controller unit is able to know how the level of compensation is needed during an offset mode in the supply voltage. The time period tells the controller unit the time period for the compensation to be performed. The type of event may for example be, read or write events of a memory, or transmits or receive events of a wireless interface. The type event information helps the controller unit to distinguish between the received enablement signals and to improve the fitting of measured supply voltage variations.

An external processing unit supplied by the same battery as the amplifier may be configured to generate the enablement signal to the controller unit. The external processing unit may be an RF processing unit, a memory unit or any kind of a processing unit within a hearing device.

The external processing unit may be configured to provide the enablement signal when the external processing unit performs an event, such as a wireless transmit or receive event, a memory write or read event or other event that cause pulsed current draw on the supply voltage causing supply voltage variation on the supply voltage to the amplifier. The external processing unit may be connected directly or indirectly to the controller unit.

The enablement signal determines the time period indicating a time period of the transmit or receive event or indicating a time period of the write or read event of the memory unit. The determined time period may be based on a time period of an event of any components within a hearing device.

The enablement signal may further determine the time of when the event starts.

The fitting may be based on a fitting of measured amplitudes of the variations in the supply voltage as a function of a second parameter and/or based on a fitting of measured time periods of the respective measured amplitudes as a function of the second parameter, where the second parameter may be a measure of time of when the supply voltage is measured.

The acoustical signal at the output of the amplifier may be expressed by a transfer function, and the digital signal processor may be configured to modify the transfer function by, e.g. multiplying a constant which is calculated based on the compensating signal, and where the digital signal processor may be configured to vary the constant based on the compensating signal for minimizing variation in the acoustical signal at the predicted offset modes at the output of the amplifier.

A second analog-to-digital converter may be configured to detect the time period of when the supply voltage is in the offset mode and transmitting the enablement signal in digital domain to the controller unit. The second analog-to-digital converter may be implemented on the same printed circuit board as the first analog-to-digital converter.

The measured voltage may be sampled on the supply voltage to the amplifier or on the output of the amplifier.

In a classical feedback compensation amplifier system the speed of sampling on the supply voltage is crucial, however, in the disclosed amplifier system, which is based on an adjusted feed forward compensation, the speed of sampling on the supply voltage or on the output of the amplifier is not that crucial as in the feedback solution. Thereby, the disclosed amplifier system is more robust and stabile compared to a regular feedback solution.

The digital signal processor comprises a noise shaper for quantizing the acoustical signal before transmitting the acoustical signal to the amplifier, and wherein the noise shaper receives the compensating signal.

The fitting of the measured supply voltages may be a linear fitting, polynomial fitting or any mathematical fitting method.

The enablement signal informs the controller unit the event of the enablement signal, and the controller unit may then be configured to distinguishing between the received enablement signals and performing a fitting of the measured voltages which are relevant for a specific event, such as a transmit, receive, write or read event.

A further object of the present disclosure is achieved by a method for minimizing variation in an acoustical signal caused by variation in gain of an amplifier, comprising:
  providing a supply voltage to the amplifier,
  providing the acoustical signal to the amplifier,
  receiving an enablement signal when the supply voltage is in an offset mode, and requesting a measured voltage in digital domain during a time period based on the enablement signal,
  measuring the supply voltage to the amplifier when receiving the request from the controller unit, where variations in the measured voltage relates to variations in the supply voltage during the time period
  generating a compensating signal based on the measured variation in the voltage during the time period,
  transmitting the compensating signal to the digital signal processor, and
  minimizing the variation in the acoustical signal at the output of the amplifier during the time period by compensating the variation in gain of the amplifier based on the compensating signal.

The generation of the enablement signal may be provided by an external processing unit which is supplied by the same battery as the amplifier.

A hearing device may comprise the amplifier system as described above.

BRIEF DESCRIPTION OF DRAWINGS

The objects of the disclosure may be best understood from the following detailed description taken in conjunction with the accompanying figures. The figures are schematic and simplified for clarity, and they just show details to improve the understanding of the claims, while other details are left out. Throughout, the same reference numerals are used for identical or corresponding parts. The individual features of each object may each be combined with any or all features of the other objects. These and other objects, features and/or technical effect will be apparent from and elucidated with reference to the illustrations described hereinafter in which:

DETAILED DESCRIPTION

Figure 1:
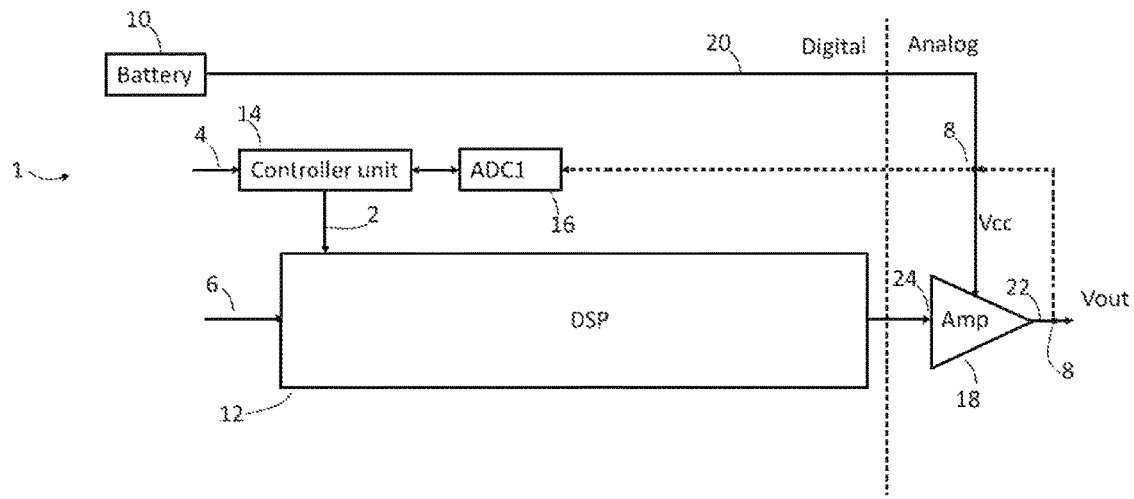
FIG. 1, shows an example of an amplifier system.

The detailed description set forth below in connection with the appended drawings is intended as a description of various configurations. The detailed description includes specific details for the purpose of providing a thorough understanding of various concepts. However, it will be apparent to those skilled in the art that these concepts may be practiced without these specific details. Several objects of the apparatus and methods are described by various blocks, functional units, modules, components, circuits, steps, processes, algorithms, etc. (collectively referred to as "elements"). Depending upon particular application, design constraints or other reasons, these elements may be implemented using electronic hardware, computer program, or any combination thereof.

A hearing device may include a hearing aid that is adapted to improve or augment the hearing capability of a user by receiving an acoustic signal from a user's surroundings, generating a corresponding audio signal, possibly modifying the audio signal and providing the possibly modified audio signal as an audible signal to at least one of the user's ears. The "hearing device" may further refer to a device such as an earphone or a headset adapted to receive an audio signal electronically, possibly modifying the audio signal and providing the possibly modified audio signals as an audible signal to at least one of the user's ears. Such audible signals may be provided in the form of an acoustic signal radiated into the user's outer ear, or an acoustic signal transferred as mechanical vibrations to the user's inner ears through bone structure of the user's head and/or through parts of middle ear of the user or electric signals transferred directly or indirectly to cochlear nerve and/or to auditory cortex of the user.

The hearing device is adapted to be worn in any known way. This may include i) arranging a unit of the hearing device behind the ear with a tube leading air-borne acoustic signals or with a receiver/loudspeaker arranged close to or in the ear canal such as in a Behind-the-Ear type hearing aid or a Receiver-in-the Ear type hearing aid, and/or ii) arranging the hearing device entirely or partly in the pinna and/or in the ear canal of the user such as in a In-the-Ear type hearing aid or In-the-Canal/Completely-in-Canal type hearing aid, or iii) arranging a unit of the hearing device attached to a fixture implanted into the skull bone such as in Bone Anchored Hearing Aid or Cochlear Implant, or iv) arranging a unit of the hearing device as an entirely or partly implanted unit such as in Bone Anchored Hearing Aid or Cochlear Implant.

A hearing device may be part of a "hearing system", which refers to a system comprising one or two hearing devices, disclosed in present description, and a "binaural hearing system" refers to a system comprising two hearing devices where the devices are adapted to cooperatively provide audible signals to both of the user's ears. The hearing system or binaural hearing system may further include auxiliary device(s) that communicates with at least one hearing device, the auxiliary device affecting the operation of the hearing devices and/or benefitting from the functioning of the hearing devices. A wired or wireless communication link between the at least one hearing device and the auxiliary device is established that allows for exchanging information (e.g. control and status signals, possibly audio signals) between the at least one hearing device and the auxiliary device. Such auxiliary devices may include at least one of remote controls, remote microphones, audio gateway devices, mobile phones, public-address systems, car audio systems or music players or a combination thereof. The audio gateway is adapted to receive a multitude of audio signals such as from an entertainment device like a TV or a music player, a telephone apparatus like a mobile telephone or a computer, a PC. The audio gateway is further adapted to select and/or combine an appropriate one of the received audio signals (or combination of signals) for transmission to the at least one hearing device. The remote control is adapted to control functionality and operation of the at least one hearing devices. The function of the remote control may be implemented in a SmartPhone or other electronic device, the SmartPhone/electronic device possibly running an application that controls functionality of the at least one hearing device.

In general, a hearing device includes i) an input unit such as a microphone for receiving an acoustic signal from a user's surroundings and providing a corresponding input audio signal, and/or ii) a receiving unit for electronically receiving an input audio signal. The hearing device further includes a signal processing unit for processing the input audio signal and an output unit for providing an audible signal to the user in dependence on the processed audio signal.

The input unit may include multiple input microphones, e.g. for providing direction-dependent audio signal processing. Such directional microphone system is adapted to enhance a target acoustic source among a multitude of acoustic sources in the user's environment. In one object, the directional system is adapted to detect (such as adaptively detect) from which direction a particular part of the microphone signal originates. This may be achieved by using conventionally known methods. The signal processing unit may include amplifier that is adapted to apply a frequency dependent gain to the input audio signal. The signal processing unit may further be adapted to provide other relevant functionality such as compression, noise reduction, etc. The output unit may include an output transducer such as a loudspeaker/receiver for providing an air-borne acoustic signal transcutaneously or percutaneously to the skull bone or a vibrator for providing a structure-borne or liquid-borne acoustic signal. In some hearing devices, the output unit may include one or more output electrodes for providing the electric signals such as in a Cochlear Implant.

It should be appreciated that reference throughout this specification to "one embodiment" or "an embodiment" or "an object" or features included as "may" means that a particular feature, structure or characteristic described in connection with the embodiment is included in at least one embodiment of the disclosure. Furthermore, the particular features, structures or characteristics may be combined as suitable in one or more embodiments of the disclosure. The previous description is provided to enable any person skilled in the art to practice the various objects described herein. Various modifications to these objects will be readily apparent to those skilled in the art, and the generic principles defined herein may be applied to other objects.

The claims are not intended to be limited to the objects shown herein, but is to be accorded the full scope consistent with the language of the claims, wherein reference to an element in the singular is not intended to mean "one and only one" unless specifically so stated, but rather "one or more." Unless specifically stated otherwise, the term "some" refers to one or more.

Accordingly, the scope should be judged in terms of the claims that follows.

FIG. 1 shows an example of an amplifier system 1 comprising a battery 10 transferring a supply voltage (Vcc) 20 to an amplifier 18. A digital signal processor (DSP) 12 is connected to the amplifier 18 where the DSP transfer an acoustical signal 6 received from for example a microphone 41 (not shown in this figure). Furthermore, the DSP may be configured to receive multiple acoustic signals from multiple microphones (again, not shown in this figure). The amplifier 18 receives at the input 24 the acoustical signal 6 and applies a gain to the acoustical signal 6. The amplifier 18 may then transfer the amplified acoustical signal via the amplifier output (Vout) 8 to for example a receiver 43 (e.g. a speaker, not shown in this figure). A controller unit 14 is connected to the DSP 12 and a first analog-to-digital converter 16. The controller unit 14 is configured to receive an enablement signal 4 and then requesting a measured voltage in digital domain and during a time period based on the enablement signal. The first analog-to-digital converter 16 receives then the request from the controller unit and measures 8 the supply voltage to the amplifier 18 The measured voltage is then transmitted to the controller unit. The controller unit performs a fitting based on the measured voltages and based on the information provided by the enablement signals, and the controller unit predicts then the coming offset mode in the supply voltage based on the fitting and the enablement signals. The prediction of the offset mode, which is based on the fitting, includes the time of when the offset mode will appear in the supply voltage, the amplitude level of the variation in the offset mode and the time period of the offset mode.

The compensation signal 2 is provided based on the fitting to the digital signal processor 12. The digital signal processor 12 is then configured to minimize variation in the acoustical signal 6 at the output 22 of the amplifier 8 when the supply voltage 20 is in an offset mode 52 which is predicted by the controller unit 14.

Figure 2:
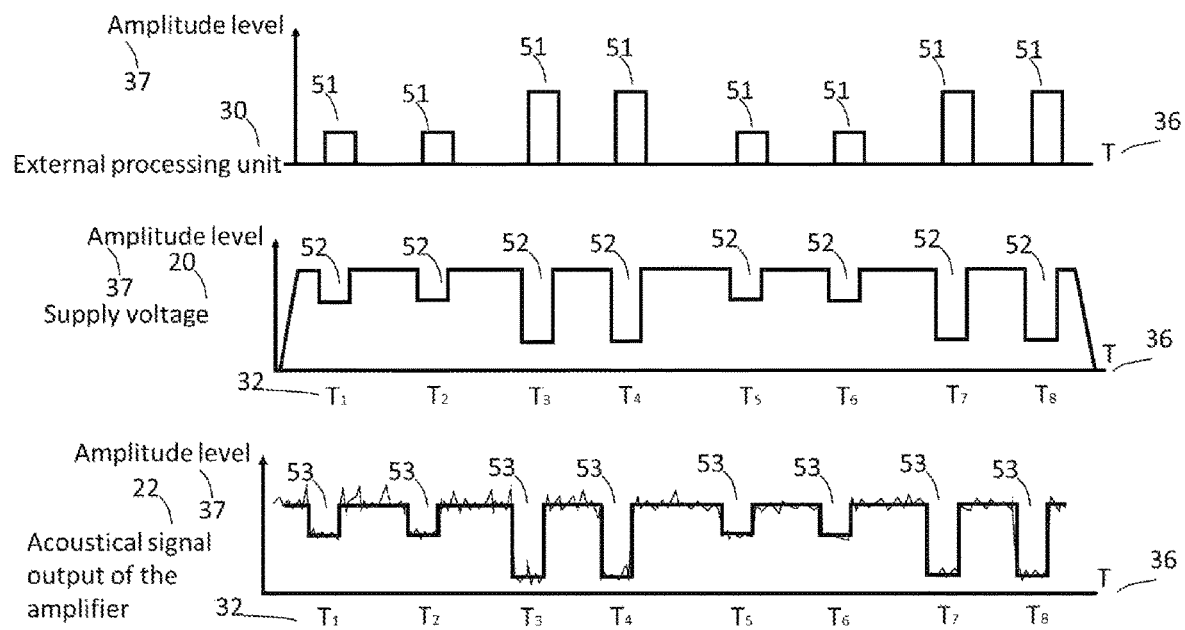
FIG. 2, shows an example of a timing diagram of the amplifier.

FIG. 2 shows an example of a timing diagram of the amplifier system 1 without an enablement signal. An event 51 of an external processing unit 30 may represent a transmission or receive of multiple data packets or audio packets 51 with different amplitude levels 37 and time periods ($T_1$ to $T_8$) and at different times 36. For example, at time period $T_1$ the external processing unit 30 transmits a data packet during a time period $T_1$ with an amplitude level 37 and at a time 36. It is seen that the amplitude level 37 in the supply voltage 20 drops because of the event in the external processing unit 30. The time period of the drop is either equal to or similar to the time period of the event of the external processing unit 30. The supply voltage is in an offset mode 52 when the supply voltage short termly drops below or above for example a supply voltage threshold. The supply voltage threshold may be determined by the average supply voltage of the battery as being between +/−0.1% to +/−10%, +/−1% to +/−25% or +/−0.05% to +/−5% of the average supply voltage. The average supply voltage varies proportional to the depletion of the battery. In this particular example the supply voltage has dropped below the supply voltage threshold at $T_1$ to $T_8$. The acoustical signal at the output of the amplifier 22 experiences a drop 53 in the amplitude level 37 when the supply voltage 20 experience a drop 52. In this particular example the user would experience a poor audio quality of the acoustical signal.

Figure 3:
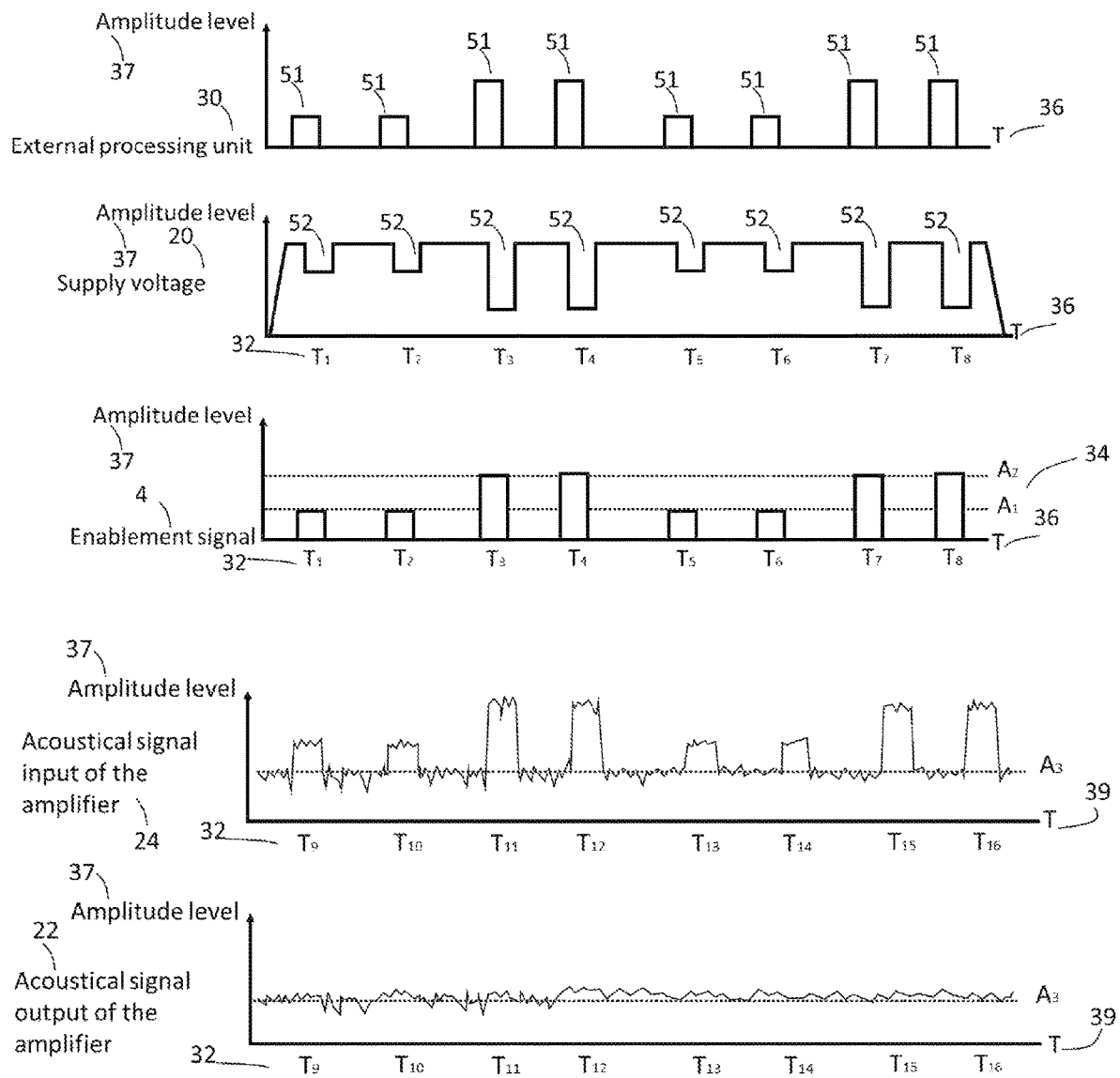
FIG. 3, shows an example of a timing diagram.

FIG. 3 shows an example of a timing diagram of the amplifier system 1 including an enablement signal 4. The example is similar to the one disclosed in FIG. 2, enablement signals 4 are generated at a specific time 36 representing an event 51 of the external processing unit 30. Each enablement signal 4 includes information of an event including amplitude level 34 ($A_1$ or $A_2$), a time period ($T_1$ to $T_8$) 32 and a time 36 which is measure of when the event occurred. As explained before, the controller unit 14 receives information about the variation 52 on the supply voltage 20 via the enablement signal 4, and the controller is then configured to predict when the next variations 52 in the supply voltage 20 will appear based on the fitting of both the amplitudes and/or time periods of the events. Based on the prediction, the controller unit 14 generates and transmits a compensation signal 2 to the DSP 12. The DSP 12 provides the compensation signal 2 into the acoustical signal 6 by, e.g. multiplying a constant, depending on the compensation signal 2, to for example a transfer function of the acoustical signal 6 going out of the amplifier 18. In this example, the compensation results in an amplification of the acoustical signal 6 at predicted times 39, and within the predictive time periods ($T_9$ to $T_{16}$), and with predictive amplification levels. The amplification at each predicted time 39 and time periods ($T_9$ to $T_{16}$) are different. The amplification is depending on the amount of power needed to process the respective predicted events. The amplified acoustical signal, at the predicted events ($T_9$ to $T_{16}$) enters the amplifier 18 and at the output 22 of the amplifier 18 the variations 53 in the acoustic signal output of the amplifier 22 have been eliminated or reduced resulting in acoustical signals 6 which will sound unaffected by the variations 53 in the supply voltage 20.

Figure 4:
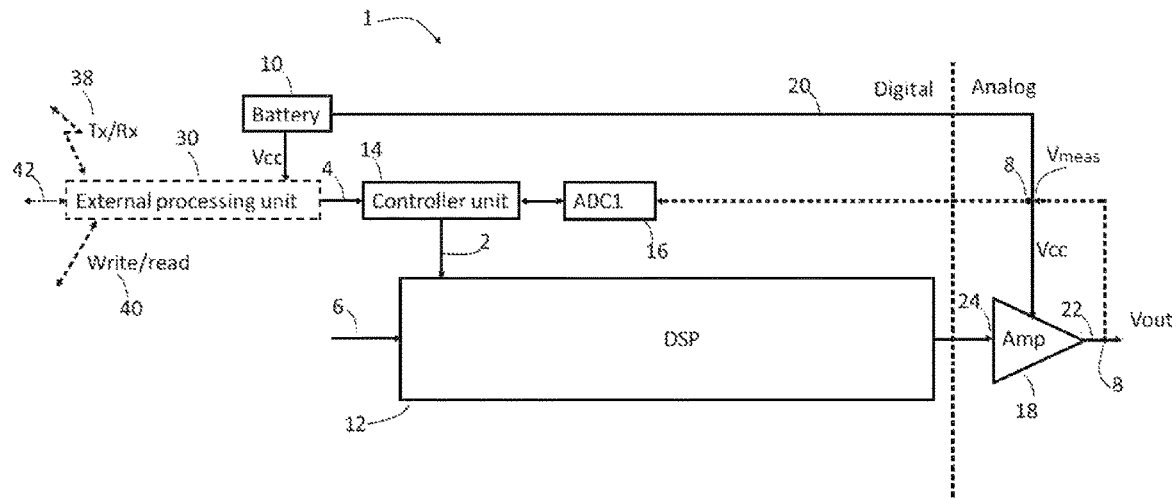
FIG. 4, shows an example of the amplifier system.

FIG. 4 shows an example of the amplifier system 1, where the enablement signal 4 is provided by the external processing unit 30 configured to either transmit or receive 38 data packets or audio packets, or write or read 40 to a memory unit. The external processing unit 30 may be configured to any events 42 within a hearing device. In this example, the external processing unit 30 may be configured to measure the supply voltage Vcc from the battery 10, and based on the measured supply voltage the external processing unit 30 is configured to generate the enablement signal 4. Additionally, the enablement signal 4may be generated if the measured supply voltage Vcc is below or above an average supply voltage over a given time period, i.e. the supply voltage is in an offset mode.

Additionally, or alternatively, the external processing unit 30 may be configured to either transmit or receive 38 data packets or audio packets or configured to detect whether the data packets or audio packets are transmitted or received 38 via a transceiver unit (not shown in this figure). For example, the transceiver unit and the amplifier system 1 may be comprised by a hearing device. For example, when the external processing unit 30 detects a transmission or a receive 38 event of a data packer or an audio packet, the enablement signal 4 is generated. The enablement signal 4 is generated because a voltage drop in the supply voltage Vcc will appear due to the transmission event 38 or the receive event 38 if no compensation is provided to the gain of the amplifier 18.

Additionally, or alternatively, the external processing unit 30 may be configured to detect a write or a read event 40 to a memory unit and generating the enablement signal a voltage drop in the supply voltage Vcc will appear due to the write event 40 or to the read event 40 if not compensation is provided to the gain of the amplifier 18.

Figures 5A, 5B:
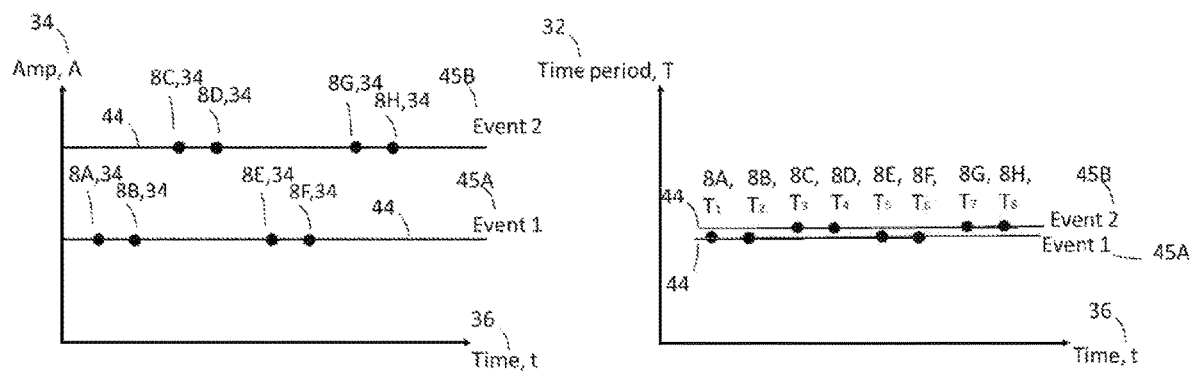
FIGS. 5A and 5B, show an example of a fitting.

FIGS. 5A and 5B show an example of the controller unit 14 predicting the next offset modes based on a fitting 44 of measured amplitudes 34 of the measured voltages (8A to 8H) as a function of a second parameter (which in this example is the time 36) and/or based on a fitting of measured time periods ($T_1$-$T_8$) of the respective measured amplitudes (8A to 8H, 34) as a function of the second parameter, where the second parameter may be the time 36. The time 36 may be a measure of when the measured has been performed, or when the enablement signal is received, or when an event of an external processing unit 30 has occurred.

FIG. 5A shows that the fitting 44 of the measured voltages (8A to 8H) are divided into two groups, each group representing an event. In this example a first group event 45A comprises measured amplitudes 34 of measured voltages (8A, 8B, 8E and 8F) when the external processing unit 30 is transmitting data packets. The group of events further comprises a second group event 45B comprising measured amplitudes 34 of measured voltages (8C, 8D, 8G and 8H) when the external processing unit 30 is receiving data packets. The first group event 45A may represent an event of a first external processing unit being a memory unit doing a memory write procedure, and the second group event 45B may represent an event of a second external processing unit being a RF processing unit doing a receive of data packet event.

By dividing the measured voltages (8A to 8H) into group events results in an improved fitting of respective events, and thereby, the controller unit is able to predict more precise for the coming events the amount of power the events are drawing from the battery, and which in this example will result in a more precise estimation of how much amplification should be provided to the acoustical signal for each predicted events (i.e. predicted offset modes in the supply voltage, 20).

FIG. 5B shows a similar example as explained in FIG. 5A, but where the fitting is based on the measured time periods ($T_1$-$T_8$) of the measured voltages (8A to 8H) of each events. The events are divided into a first group event 45A and a second group event 45B for events similar to the example in FIG. 5A.

By dividing the measured voltages (8A to 8H) into group events results in an improved fitting of respective events, and thereby, the controller unit is able to predict more precise the time period of each amplification (8A to 8H, 34) for the next offset modes.

Figure 6:
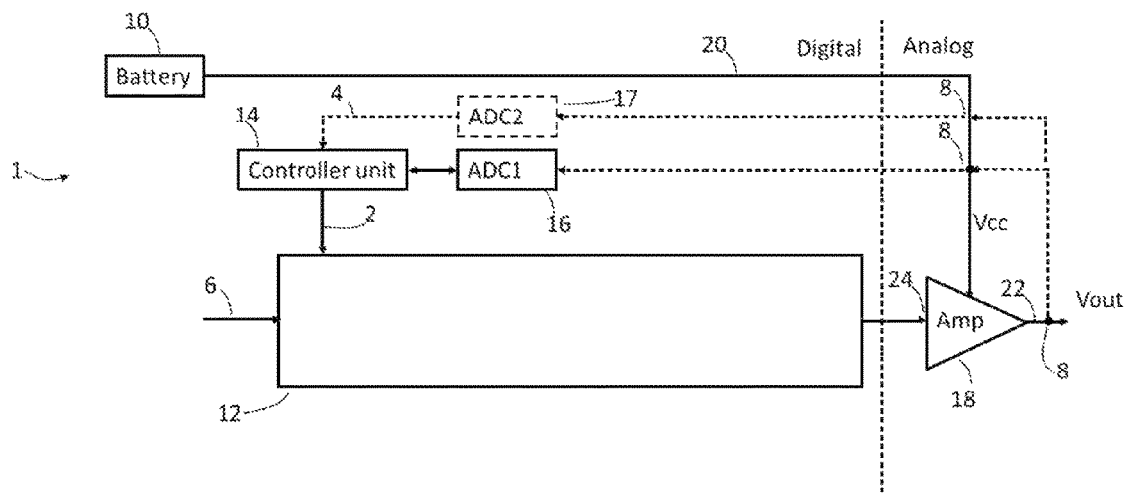
FIG. 6, shows an example of the amplifier system.

FIG. 6 shows an example of the amplifier system 1, where in this example the enablement signal 4 is generated by a second analog to digital converter 17. The second analog-to-digital converter 17 is configured to detect the time period ($T_1$ to $T_8$) of when the supply voltage is in the offset mode 52 and transmitting the enablement signal 4 in digital domain to the controller unit 14. The enablement signal 4 is generated by the second analog-to-digital converter 17 when the supply voltage is in the offset mode 52.

Figure 7:
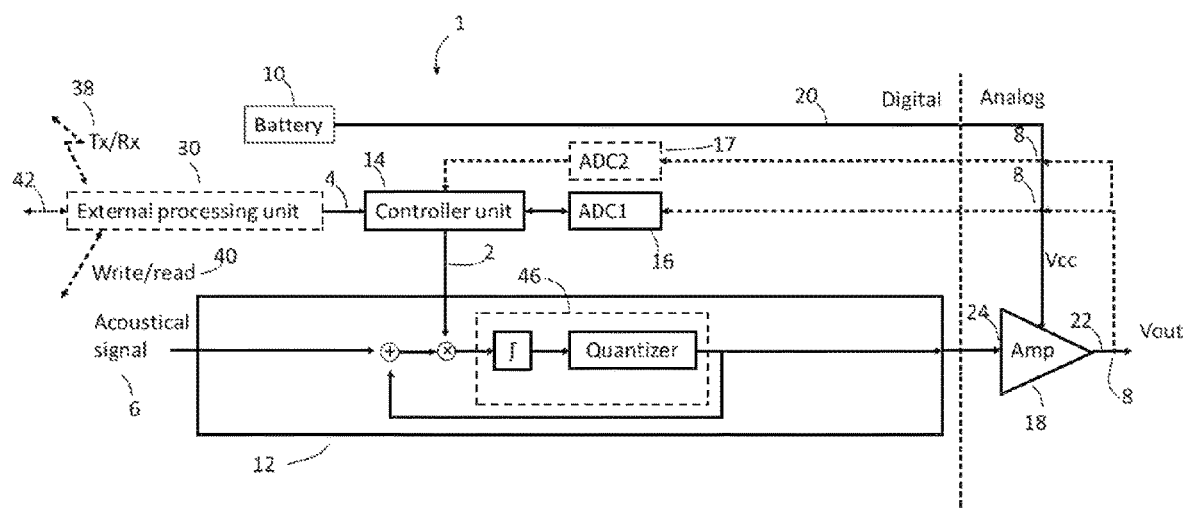
FIG. 7, shows an example of the amplifier system.

FIG. 7 shows the amplifier system 1 where the enablement signal 4 is either provided by the external processing unit 30 described in FIG. 4, or the second analog-to-digital converter 17 described in FIG. 6. In this particular example the compensating signals 2 is transmitted to a multiplier within the digital signal processor and then forwarded to a noise shaper 46 within the digital signal processor 12. Thereby, the delay of performing the compensation is reduced. The multiplier provides a gain to the acoustical signal, wherein the gain is determined by the compensating signals 2. Again, the controller unit 14 can be connected with multiple external processing units.

Figure 8:
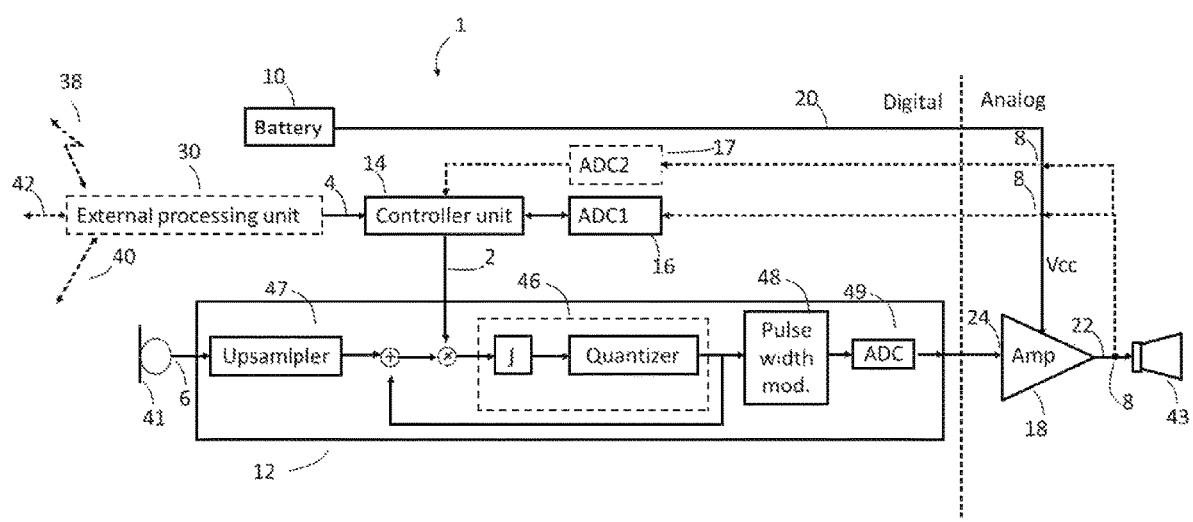
FIG. 8, shows an example of the amplifier system in a hearing device.

FIG. 8 shows the amplifier system 1 in a hearing device, where the enablement signal 4 is generated by the external processing unit 30 and/or the second analog-to-digital converter 17. The acoustical signal 6 is generated by a microphone 41 and transmitted into an upsampler 47. Furthermore, the digital signal processor 12 comprises a pulse width modulator 48 and a third analog-to-digital converter 49. The compensated acoustical signal output 22 of the amplifier 18 is received by a speaker 43.

The amplifier system 1 described in FIGS. 1 to 8 may be comprised by a hearing device, such as a hearing aid, a headphone or a headset.

Figure 9:
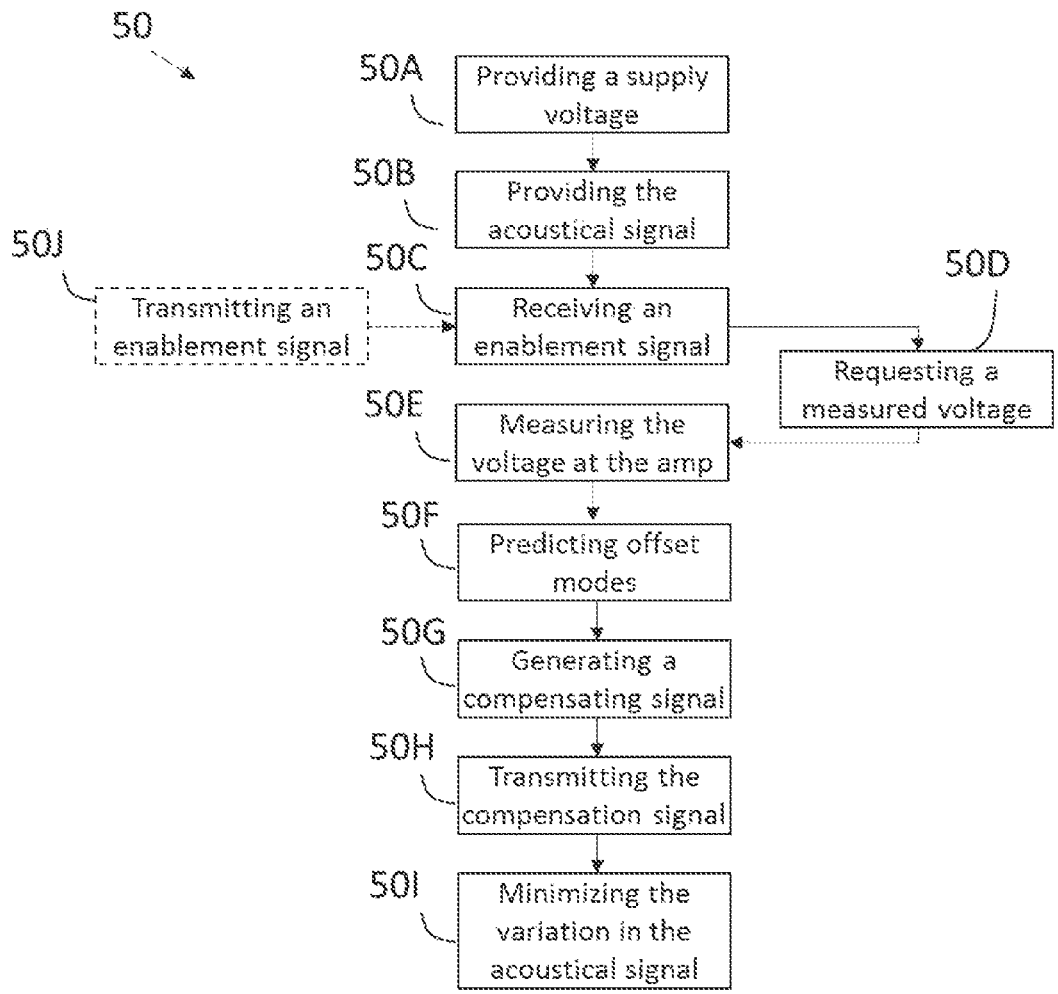
FIG. 9, illustrates a flow diagram of a method.

FIG. 9 illustrates a flow diagram of a method 50 for minimizing variation in the acoustical signal 6 caused by variation in gain of the amplifier 18. The method comprising: providing a supply voltage to the amplifier 50A, providing the acoustical signal to the amplifier 50B, receiving an enablement signal when the supply voltage is in an offset mode 50C, and requesting a measured voltage in digital domain during a time period based on the enablement signal 50D, measuring the voltage to the amplifier when receiving the request from the controller unit 50E, where variations in the measured voltage relates to variations in the supply voltage during the time period, predicting offset modes in the supply voltage based on a fitting of the measured voltages 50F, generating a compensating signal based on the fitting 50G, transmitting the compensating signal to the digital signal processor 50H, and minimizing the variation at the predicted offset modes in the acoustical signal at the output of the amplifier by compensating the variation in gain of the amplifier based on the compensating signal 50I.

The method 50 comprises a transmission of the enablement signal from an external processing unit 30 or a second analog-to-digital converter 17.

| | |
|---|---|
| 1 | Amplifier system |
| 2 | Compensation signal |
| 4 | Enablement signal |
| 6 | Acoustic signal |
| 8 | Measured voltage |
| 10 | Battery |
| 12 | Digital signal processor, DSP. |
| 14 | Controller unit |
| 16 | First Analog to digital converter |
| 17 | Second Analog to digital converter |
| 18 | Amplifier |
| 20 | Supply voltage |
| 22 | Output of the amplifier |
| 24 | Input of the amplifier |
| 30 | External processing unit |
| 32 | Time period |
| 34 | Measured Amplitude |
| 36 | Time |
| 37 | Amplitude level |
| 38 | Transmit/receive signal |
| 39 | Predicted time |
| 40 | Write/read signal |
| 41 | microphone |
| 42 | Other signal |
| 43 | Speaker |
| 44 | Fitting |
| 45A | First group event |
| 45B | Second group event |
| 46 | Noise shaper |
| 47 | Upsampler |
| 48 | Pulse width modulator |
| 49 | Third analog to digital converter |
| 50 | Method |
| 50A | Providing a supply voltage |
| 50B | Providing the acoustical signal |
| 50C | Receiving an enablement signal |
| 50D | Requesting a measured voltage |
| 50E | Measuring the voltage at the amp |
| 50F | Predicting offset modes |
| 50G | Generating a compensating signal |
| 50H | Transmitting the compensation signal |
| 50I | Minimizing the variation in the acoustical signal |
| 50J | Transmitting an enablement signal |
| 51 | Multiple data/audio packets |
| 52 | First mode |
| 53 | Disturbance in the acoustical signal |

The invention claimed is:

1. A hearing device comprising:
an amplifier configured to receive an acoustical signal;
a battery configured to provide a supply voltage to the amplifier;
a processor configured to generate an enablement signal when the processor performs a processing that causes a drop in the supply voltage, the processor being configured to transmit the enablement signal to a controller configured to receive the enablement signal;
wherein:
the processor is configured to measure the supply voltage from the battery;
the processor is configured to, based on the measure of the supply voltage, generate the enablement signal;
the controller is configured to generate a compensating signal based on an estimation of variation in the supply voltage; and
the hearing device is configured to minimize the variation in the acoustical signal by adjusting the acoustical signal based on the compensating signal.

2. A hearing device according to claim 1, wherein the processor is configured to perform an event selected from a wireless transmit event, a wireless receive event, a memory write event, and a memory read event.

3. A hearing device according to claim 1, wherein the enablement signal is generated if the measured supply voltage Vcc is below or above an average supply voltage over a given time period.

4. A hearing device according to claim 3, wherein the time period is a time period of a transmit or receive event or a time period of the memory write or read event or a time period of a measurement of the supply voltage.

5. A hearing device according to claim 1, wherein the acoustical signal at an output of the amplifier is expressed by a transfer function, wherein the hearing device is configured to modify the transfer function by introducing a constant which is calculated based on the compensating signal into the transfer function, and wherein the hearing device is configured to vary the constant based on the compensating signal for minimizing variation in the acoustical signal caused by variation in gain of the amplifier.

6. A hearing device according to claim 1, wherein the hearing device further comprises a noise shaper configured to quantize the acoustical signal before transmitting the acoustical signal to the amplifier, and wherein the noise shaper is further configured to receive the compensating signal.

7. A hearing device according to claim 1, wherein the hearing device is a hearing aid.

8. A hearing device according to claim 1, wherein the drop in the supply voltage is a short-term drop in the supply voltage.

9. A hearing device comprising:
an amplifier configured to receive an acoustical signal;
a battery configured to provide a supply voltage to the amplifier;
a processor configured to generate an enablement signal when the processor performs a processing that causes a drop in the supply voltage, the processor being configured to transmit the enablement signal to a controller configured to receive the enablement signal,
wherein the controller is configured to generate a compensating signal based on the enablement signal; and
wherein the hearing device is configured to minimize the variation in the acoustical signal by providing the compensating signal into the acoustical signal.

10. A hearing device according to claim 9, wherein the processor is configured to perform an event selected from a wireless transmit event, a wireless receive event, a memory write event, and a memory read event.

11. A hearing device according to claim 9, wherein the enablement signal is generated if a measured supply voltage Vcc is below or above an average supply voltage over a given time period.

12. A hearing device according to claim 11, wherein the time period is a time period of the transmit or receive event or a time period of the memory write or read event or a time period of a measurement of the supply voltage.

13. A hearing device according to claim 9, wherein the acoustical signal at an output of the amplifier is expressed by a transfer function, wherein the hearing device is configured to modify the transfer function by introducing a constant which is calculated based on the compensating signal into the transfer function, and wherein the hearing device is configured to vary the constant based on the compensating signal for minimizing variation in the acoustical signal caused by variation in gain of the amplifier.

14. A hearing device according to claim 9, wherein the hearing device further comprises a noise shaper configured to quantize the acoustical signal before transmitting the acoustical signal to the amplifier, and wherein the noise shaper is further configured to receive the compensating signal.

15. A hearing device according to claim 9, wherein the hearing device is a hearing aid.

16. A hearing device according to claim 9, wherein the drop in the supply voltage is a short-term drop in the supply voltage.

17. A hearing device comprising:
an amplifier configured to receive an acoustical signal;
a battery configured to provide a supply voltage to the amplifier;
a processor configured to generate an enablement signal when detecting a drop in the supply voltage, the processor being configured to transmit the enablement signal to a controller configured to receive the enablement signal;
wherein:
the processor is configured to measure the supply voltage from the battery;
the processor is configured to, based on the measure of the supply voltage, generate the enablement signal;
the controller is configured to generate a compensating signal based on an estimation of variation in the supply voltage; and
the hearing device is configured to minimize the variation in the acoustical signal by adjusting the acoustical signal based on the compensating signal.

18. A hearing device according to claim 17, wherein the hearing device is a hearing aid.

19. A hearing device according to claim 17, wherein the enablement signal is generated if a measured supply voltage Vcc is below or above an average supply voltage over a given time period.

20. A hearing device according to claim 17, wherein the hearing device further comprises a noise shaper configured to quantize the acoustical signal before transmitting the acoustical signal to the amplifier, and wherein the noise shaper is further configured to receive the compensating signal.

* * * * *